US006229338B1

United States Patent
Coulman et al.

(10) Patent No.: US 6,229,338 B1
(45) Date of Patent: May 8, 2001

(54) METHOD AND APPARATUS FOR REDUCING DYNAMIC PROGRAMMABLE LOGIC ARRAY PROPAGATION DELAY

(75) Inventors: Paula Kristine Coulman; Sang Hoo Dhong, both of Austin, TX (US); Joel Abraham Silberman, Somers, NY (US); Osamu Takahashi, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/498,933

(22) Filed: Feb. 4, 2000

(51) Int. Cl.[7] .................................................. H01L 25/00
(52) U.S. Cl. ................................. 326/41; 326/41; 326/47
(58) Field of Search ............................... 326/37–41, 44, 326/45, 47, 95, 98

(56) References Cited

U.S. PATENT DOCUMENTS

| 4,769,562 | * | 9/1988 | Ghisio .................................. 307/469 |
| 5,300,831 | * | 4/1994 | Pham et al. .......................... 307/465 |
| 5,331,227 | * | 7/1994 | Hawes .................................. 307/465 |
| 5,872,462 | * | 2/1999 | Ditlow et al. .......................... 326/39 |
| 5,959,465 | * | 9/1999 | Beat ....................................... 326/39 |
| 6,111,428 | * | 8/2000 | Hanatani ............................... 326/39 |

* cited by examiner

Primary Examiner—Michael Tokar
Assistant Examiner—Vibol Tan
(74) Attorney, Agent, or Firm—Casimer K. Salys; Bracewell & Patterson, L.L.P.

(57) ABSTRACT

A dynamic programmable logic array for implementing control logic in a microprocessor provides higher clock frequencies for data processing systems. The programmable logic array has a reduced propagation delay by virtue of partitioning of the interconnects within the OR plane of the array.

18 Claims, 5 Drawing Sheets

METHOD AND APPARATUS FOR REDUCING DYNAMIC PROGRAMMABLE LOGIC ARRAY PROPAGATION DELAY

CROSS-REFERENCES TO RELATED APPLICATIONS

The present invention is related to the following application filed concurrently with this application: U.S. patent application Ser. No. 09/498,934 entitled "METHOD AND APPARATUS FOR IMPLEMENTING MICROPROCESSOR CONTROL LOGIC USING DYNAMIC PROGRAMMABLE LOGIC ARRAYS". The present invention also relates to U.S. patent application Ser. No. 09/443,205 entitled "BALANCED-DELAY PROGRAMMABLE LOGIC ARRAY AND METHOD FOR BALANCING PROGRAMMABLE LOGIC ARRAY DELAYS" filed Dec. 22, 1999 having at least one common inventor and assigned to the same assignee. The specifications of the above are incorporated herein by reference.

BACKGROUND OF THE INVENTION

1. Technical Field

The present invention generally relates to programmable logic arrays (PLAs), and more particularly to a dynamic PLA having a reduced propagation delay.

2. Description of the Related Art

Microprocessor control logic has a direct impact on processing frequency and therefore processing power. Logic circuits are required that can evaluate a large number of inputs and produce a large number of outputs flexibility in determining the logical output-from-input dependencies.

A programmable logic array (PLA) is an integrated circuit device that incorporates fixed sets of AND and OR logic gates or similar functions such as NAND, NOR, XOR or XNOR with one or more interconnect planes used to create several logical combinatorial outputs from several logical inputs. The interconnect planes in a mask PLA are usually metallization layers that can be redesigned and deposited during a production run without redesigning the semiconductor layers of the device. The depositing of the mask can be performed by vapor deposition of aluminum or other metals using techniques well known in the art. The mask connects devices within an interconnect array or "plane" comprising two sets of conductors: a set of logic inputs and a set of logic gate inputs. The sets of conductors are coupled together with devices that create a logic contribution from the logic inputs to the logic gate inputs. Fuse programmable logic arrays allow the programming of a device after manufacture by using a programming unit or appropriate in-circuit electronics to allow the programming of a device.

Propagation delay of a logic circuit is the time it takes for a change of state at the input to be reflected in the state at the output. In high speed logic, it is desirable to reduce propagation delay from logic inputs to the final evaluated outputs. In asynchronous logic, an output is valid only after all of the inputs that form part of the logic equation have propagated through the gates to the output. In synchronous logic, the maximum clocking rate of the device is set by the validity of the combinatorial input to the latch, which is determined by the time it takes for all of the inputs to propagate to the input of the register latching the output.

Dynamic PLA's propagate pulses instead of voltage levels. An intermediate plane is preset to logic state, then individual nodes are reset or left alone, depending the result of the logic evaluation of the input plane. The output plane combines these intermediate results to reset output plane devices, to produce a final result. Thus, the logic levels exist as pulses in between preset intervals, that are typically provided by a synchronous system clock.

As the number of terms in the intermediate plane in a dynamic PLA increases, the size of the wire used to interconnect the input plane gate outputs and the number of gates loading these wires also increases. As a result, the time required to discharge the preset voltage from the node forming the intermediate plane output also increases because of the added capacitance. So, propagation delay increases as more logical terms are implemented by the output plane of a PLA.

It would therefore be desirable to improve dynamic mask programmable logic arrays and other topologies so that propagation delay is reduced. It would further be desirable to improve dynamic mask PLAs to make them suitable for implementing the control logic in microprocessors.

SUMMARY OF THE INVENTION

The above objectives are achieved in a dynamic programmable logic array, having an input logic plane for producing an intermediate logical result an output logic plane, coupled to the input logic plane, and the output logic plane is divided into a plurality of sub-planes for producing a plurality of partial result outputs. An output circuit combines the partial result outputs to produce a global output, so that the propagation delay of the sub-planes combined with the propagation delay of the output circuit is less than the propagation delay of an undivided output logic plane.

The invention also includes a method wherein it is determined that propagation delay may be decreased by subdividing a programmable logic array output plane, dividing the plane in response to the determination, and combining the outputs of the sub-planes. The method may be embodied in the apparatus described above.

The above as well as additional objectives, features, and advantages of the present invention will become apparent in the following detailed written description.

DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like numbers correspond to like elements and further:

DETAILED DESCRIPTION OF ILLUSTRATIVE EMBODIMENT

The use of a programmable logic array (PLA) to implement microprocessor control logic has been limited in the past. Timing skew of PLA inputs, combined with a logic depth of at least 3 gates (an input plane, an output plane and an intermediate strobed stage to stabilize the intermediate logical result), have restricted the use of PLAs in high speed microprocessors.

Using the balancing techniques disclosed in "BALANCED-DELAY PROGRAMMABLE LOGIC ARRAY AND METHOD FOR BALANCING PROGRAMMABLE LOGIC ARRAY DELAYS", along with the partitioning techniques of the present invention, a faster PLA that is suitable for use in the primary control logic path of the microprocessor has been developed. As a result, the area required for microprocessor control logic is reduced over ROM implementations, since a ROM requires storage for every possible input state. As an alternative to synthesized logic designs, the PLA provides a more stable timing approach, since the each combinatorial input path will pass through the same number of dynamic logic stages. The object of the present invention is to reduce the propagation delay of a PLA to make it suitable for applications such as microprocessor control logic.

Figure 1:
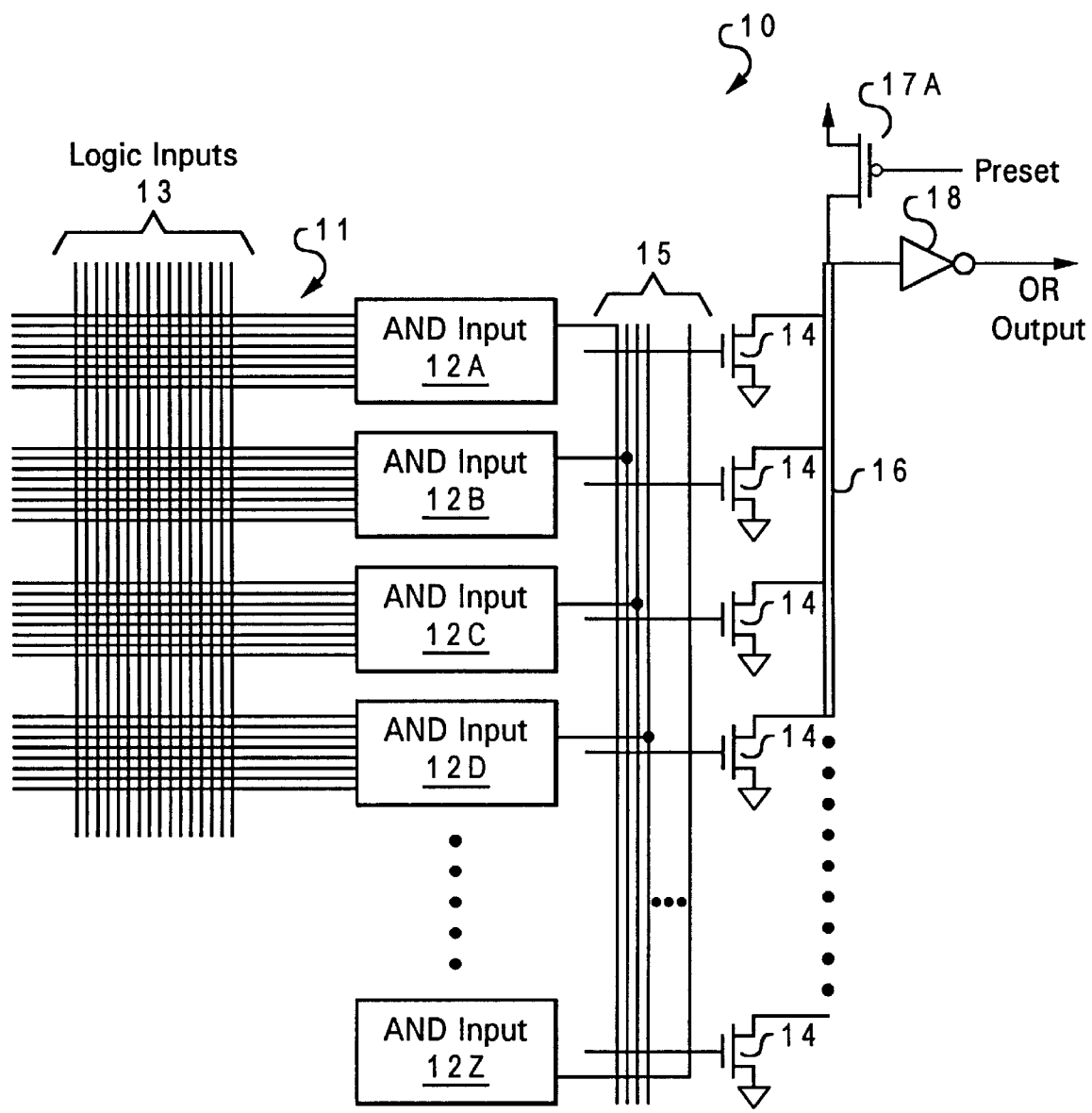
FIG. 1 is a schematic diagram of a prior art programmable logic array.

Referring now to FIG. 1, a prior art PLA 10 is depicted. Logic inputs 13 are connected to AND inputs 12A–12Z, by an interconnect matrix 11 to form a first logic plane. By connecting or not connecting a particular input 13 to a particular AND input 12, logic equations can be implemented with various dependencies on inputs PLA 10 further comprises a second logic plane wherein the outputs of the first logic plane are combined in an OR array. FIG. 1 depicts one OR term and its output.

An OR gate is formed by N-channel devices 14, coupled to outputs of the AND inputs 12 by a second interconnect matrix 15, which allows further flexibility in implementing logic functions. The outputs of N-channel devices 14 are coupled together by a summing conductor 16 to form an dynamic NOR gate with preset provided by P-channel device 17A, and the output is inverted by inverter 18 to yield an OR result. As the number of OR terms is increased in the PLA, the number of N-channel devices 14 coupled to summing conductor 16 increases, as does the length of summing conductor 16. This raises the capacitance at summing conductor 16, raising the propagation delay of the gate by increasing the rise time of summing conductor 16.

Figure 2:
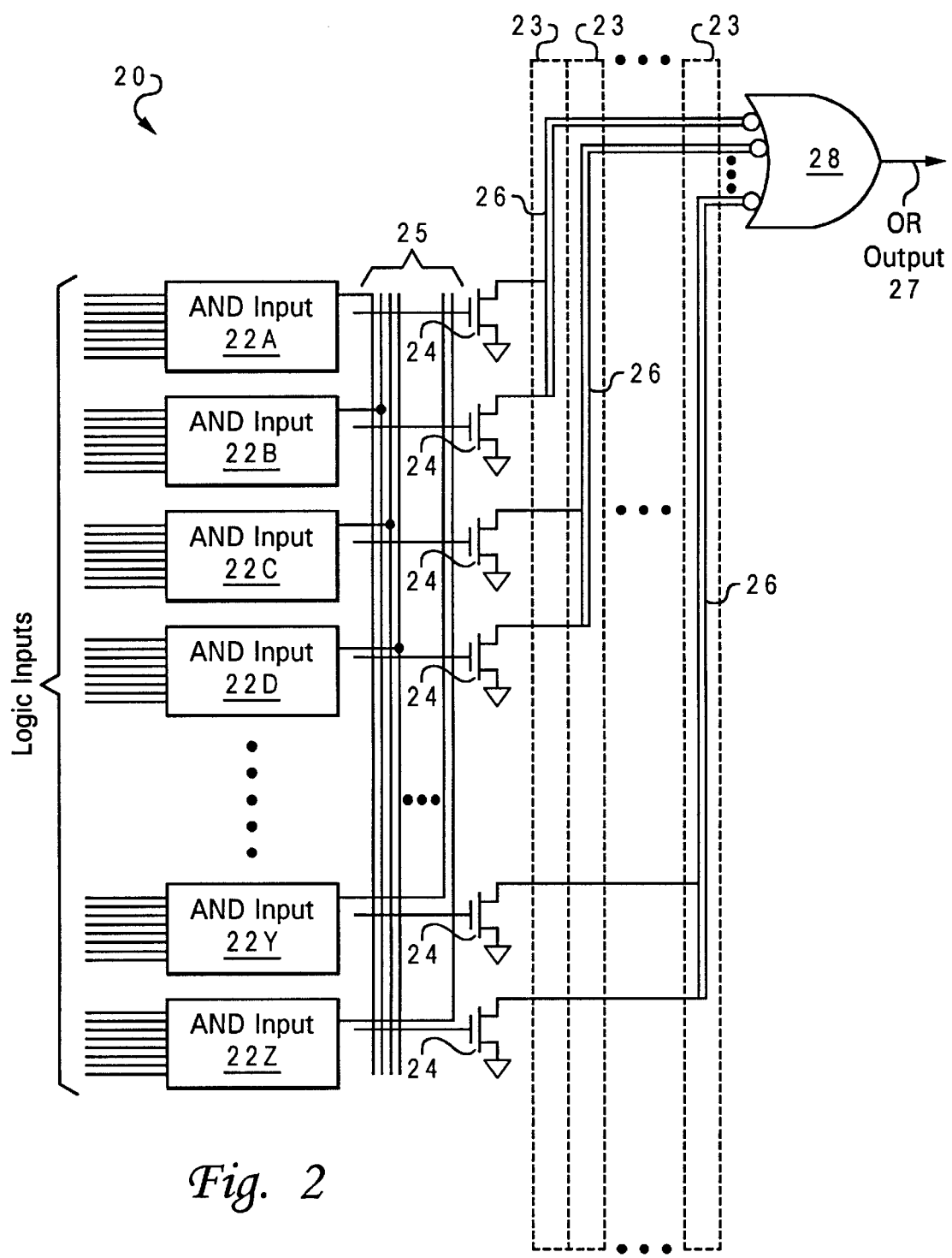
FIG. 2 is a schematic diagram of a programmable logic array in accordance with a first embodiment of the invention.

Referring now to FIG. 2, a second embodiment of a PLA 20 with reduced propagation delay is shown. In this embodiment of the invention, the OR plane comprises a plurality of sub-planes. In this illustration, two OR terms per sub-plane are shown, but generally the number will be much higher in an actual PLA, for example a PLA may have 64 OR terms grouped as 4 sub-planes combining the outputs of 16 N-channel devices 24.

Summing conductors 26, combine the outputs of N-channel devices 24, and NAND gate 28, combines the NOR outputs of each of the sub-planes to achieve an OR output 27. The capacitance at each summing conductor 26 due to N-channel devices 24, is reduced yielding lower propagation delay, but the wire capacitance of summing conductors 26 is not effectively reduced, since the connection must travel from the second interconnect matrix to NAND gate 28 through metal layer wiring tracks 23. Also, since the tracks are quite large compared to devices in the integrated circuit (generally 2 to 4 times wider than a channel length), the use of parallel wiring tracks 23, makes this embodiment of the invention quite large.

Figure 3:
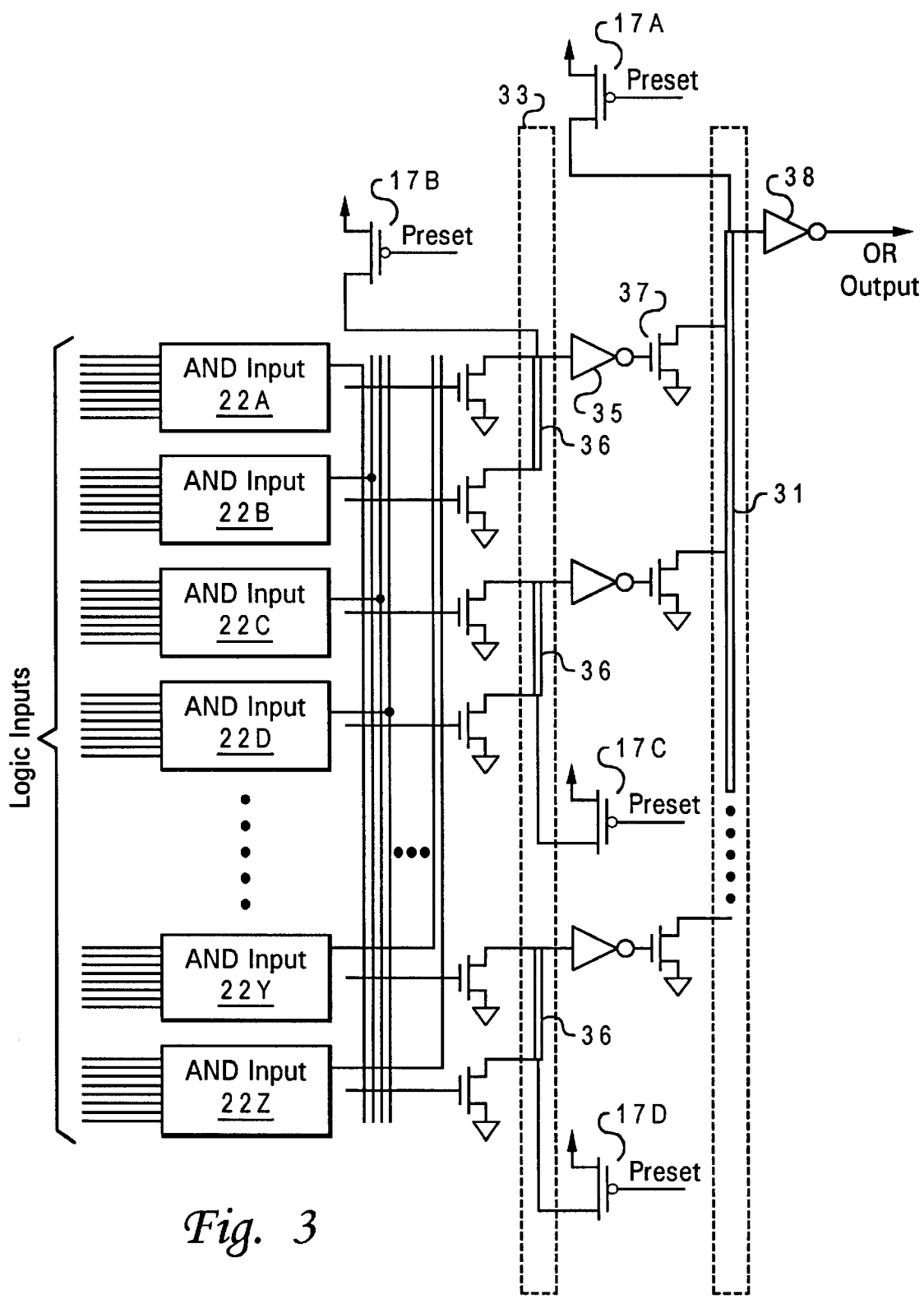
FIG. 3 is a schematic diagram of a programmable logic array in accordance with a second embodiment of the invention.

Referring now to FIG. 3, a further reduction in PLA propagation delay is made by an alternative embodiment of the invention. PLA 30, is arranged so that the OR sub-plane (partial result) summing conductors 36, are disposed end-to-end along a single wiring track 33. A separate preset device 17B–17D is needed for each of the partial result conductors. Physical gaps are introduced in the AND plane layout to allow for the breaks between summing conductors 36 and placement of local receivers 35 that are coupled with N-channel devices 37 to produce the NOR result on global conductor 31, which has an associated preset device 17A. The NOR result is inverted by inverter 38 to produce the OR output. This atypical layout provides a distinct performance advantage when a large number of terms are combined in an OR plane.

Figure 4:
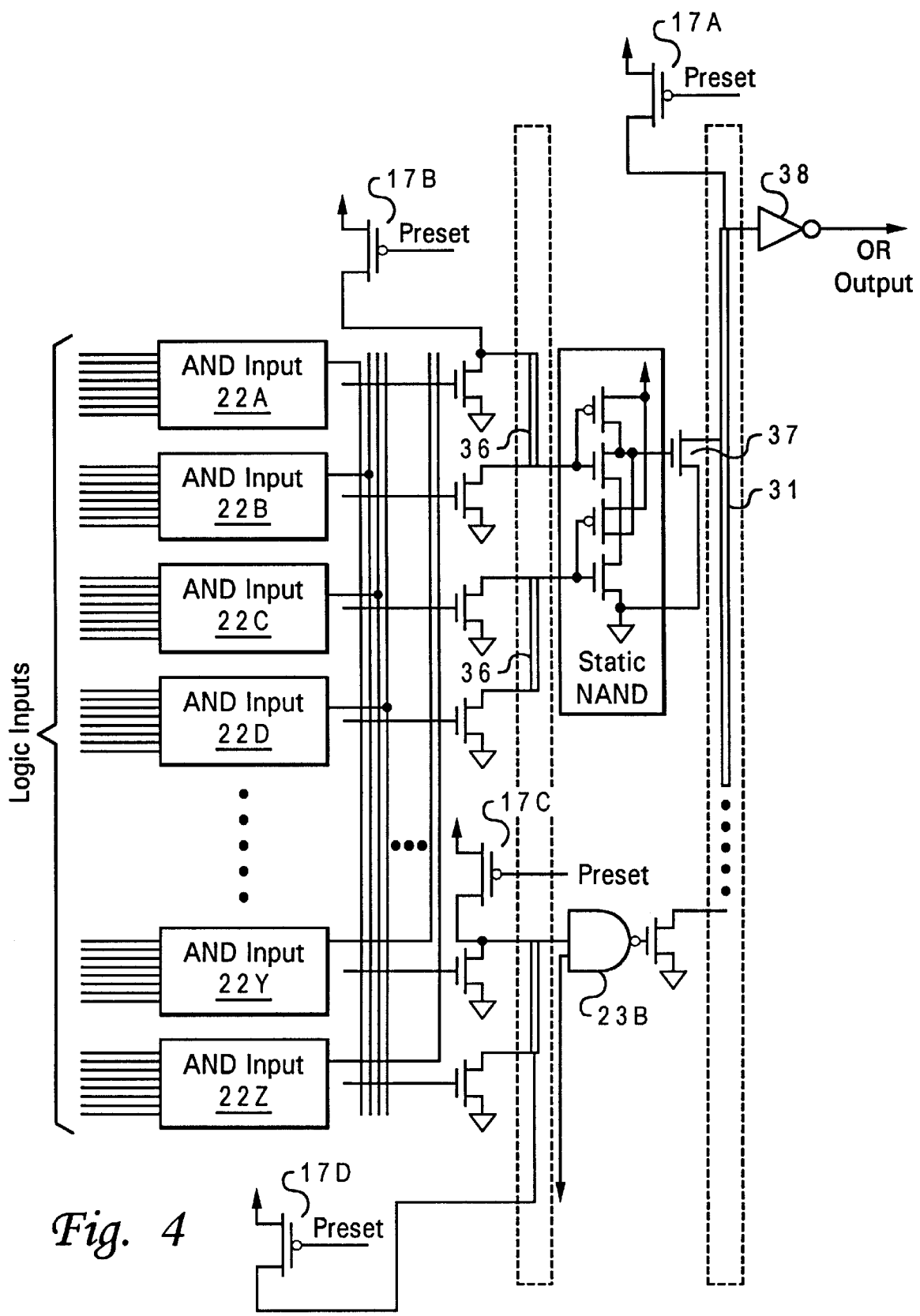
FIG. 4 is a schematic diagram of a programmable logic array in accordance with a third embodiment of the invention.

Referring now to FIG. 4, a preferred embodiment providing a further improvement is depicted. Rather than using local receivers 35, static NAND gates 23A, 23B are used to combine partial result conductor 36 signals between a pair of adjacent partial result conductors 36. This reduces the number of N-channel devices 37 coupled to global NOR conductor 31 by a factor of two, and requires less device area to implement that two receivers. Preset devices 17B–17D are still required for each of partial result conductors 36, as well as preset device 17A for global NOR conductor 31.

Figure 5:
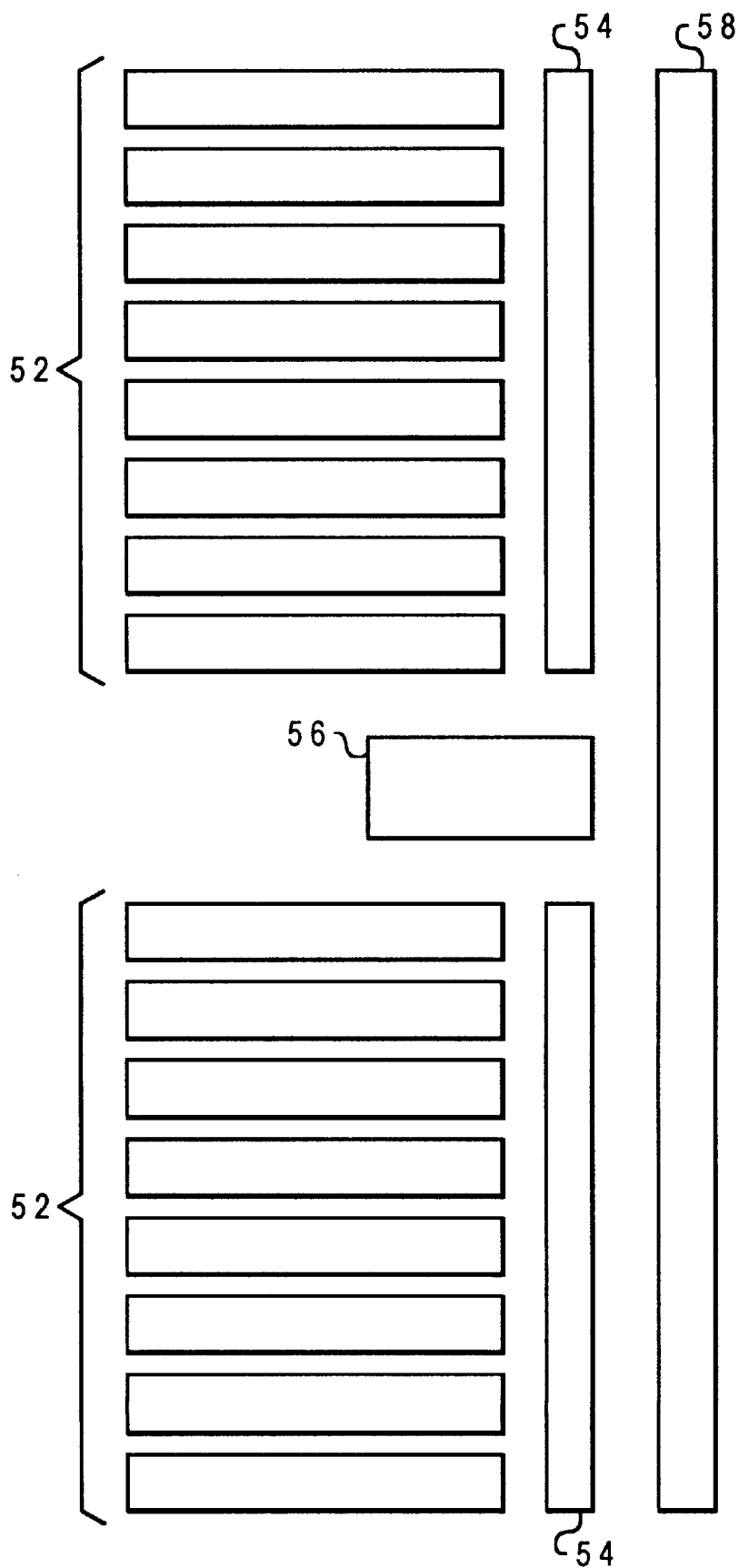
FIG. 5 is a layout drawing depicting an arrangement of devices in accordance with a preferred embodiment of the invention.

Referring now to FIG. 5, a layout of the circuit of FIG. 4 is depicted in accordance with a preferred embodiment of the invention. AND plane circuits 52 are displaced by static NAND circuit and preset transistors in area 56, causing an irregular layout due to the separation of partial result conductors 54 global NOR conductor 58 is positioned adjacent to partial result conductors 54, requiring only two wiring tracks to accomplish the combination of the outputs of AND plane circuits 52 while reducing the wiring and device capacitance where the outputs of AND plane circuits 52 are combined. This yields a lower propagation delay and therefore faster logic transitions than are possible with conventional PLA layouts.

Although the invention has been described with reference to specific embodiments, this description should not be construed in a limiting sense. Various modifications of the disclosed embodiments, as well as alternative embodiments of the invention, will become apparent to persons skilled in the art upon reference to the description of the invention. For example, the techniques of the present invention could be adapted to a PMOS implementation. It is therefore contemplated that such modifications can be made without departing from the spirit or scope of the present invention as defined in the appended claims.

What is claimed is:

1. A dynamic programmable logic array, comprising:
    an input logic plane for producing an intermediate logical result from a plurality of logic inputs;
    an output logic plane, coupled to said input logic plane, wherein said output logic plane is divided into a plurality of sub-planes for producing a plurality of partial result outputs from said intermediate logical result;
    an output circuit coupled to said output logic plane for combining said partial result outputs to produce a global output, such that a propagation delay of said sub-planes combined with a propagation delay of said output circuit is less than a propagation delay of an undivided output logic plane.

2. The dynamic programmable logic array of claim 1, wherein said sub-planes comprise NOR sub-planes and said output circuit comprises at least one NAND gate.

3. The dynamic programmable logic array of claim 1, wherein said output circuit comprises a plurality of local receivers each coupled to one of said partial result conductors and further coupled to a gate of one of a plurality of N-channel devices, said N-channel devices having a channel connection coupled to a conductor for conducting said global output.

4. The dynamic programmable logic array of claim 1, wherein said partial result outputs are combined in pairs by a plurality of two input NAND gates, and said output circuit comprises said NAND gates and further comprises a plurality of N-channel devices coupling outputs of said NAND gates to a conductor carrying said global output.

5. The dynamic programmable logic array of claim 1, wherein said partial logic results are conducted by a series of partial logic result conductors disposed end-to-end within a single partial result circuit track.

6. The dynamic programmable logic array of claim 5, wherein said global output is conducted by a global output conductor disposed within a second circuit track adjacent and parallel to said partial result circuit track.

7. The dynamic programmable logic array of claim 1, wherein said sub-planes comprise a plurality of N-channel devices, each having an associated summing node, said N-channel devices having a first channel terminal coupled to said associated summing node, a second channel terminal coupled to ground, and a gate terminal coupled to an individual one of a plurality of intermediate logic inputs.

8. The dynamic programmable logic array of claim 1, wherein said sub-planes each have an associated summing node and said output circuit comprises an OR circuit for combining the outputs of said sub-planes, wherein conductors for said summing nodes are located in a first physical track, said global output is located in a second physical track, parallel to said first physical track, said summing node conductors are disposed end-to-end along said first physical track, said output circuit combines said summing nodes by coupling said summing nodes through a plurality of N-channel devices, one associated with each summing node, and said associated transistor is located adjacent to each of said summing node conductors.

9. The dynamic programmable logic array of claim 1, wherein the quantity of said sub-circuits is two, and said output circuit comprises a two input gate.

10. The dynamic programmable logic array of claim 1, wherein said global output is conducted by a global output conductor disposed in a single circuit track.

11. A method for reducing the propagation delay of a dynamic programmable logic array, comprising the steps of:
determining that a programmable logic array output plane has a propagation delay that is greater than the sum of a propagation delay of an output combining means and the propagation delay of a divided programmable logic array output plane;
responsive to said determining step, dividing said programmable logic array output plane into partial result conductors; and
coupling said partial result conductors using an output combining means.

12. The method of claim 11, wherein said output combining means comprises at least one NAND gate and said coupling step couples said partial result conductors to said NAND gate.

13. The method of claim 11, wherein said output combining means comprises a plurality of local receivers each coupled to one of said partial result conductors and further coupled to a gate of one of a plurality of N-channel devices, said N-channel devices having a channel connection coupled to a conductor for conducting said global output, and said combining step comprises activating said N-channel devices to discharge said global output.

14. The method of claim 11, wherein said partial result conductors are combined in pairs by a plurality of two input NAND gates, said output circuit comprises said NAND gates and further comprises a plurality of N-channel devices coupling outputs of said NAND gates to a conductor carrying said global output, and said combining step comprises activating said N-channel devices to discharge said global output.

15. The method of claim 11, wherein said partial logic results are conducted by a series of partial logic result conductors disposed end-to-end within a single partial result circuit track, and said combining step comprises receiving signals from said partial result conductors.

16. The method of claim 15, wherein said global output is conducted by a global output conductor disposed within a second circuit track adjacent and parallel to said partial result circuit track, and said combining step comprises receiving signals from said partial result conductors and discharging said global output in conformance with said signals.

17. The method of claim 11, wherein said sub-planes comprise a plurality of N-channel devices, each having an associated summing node, said N-channel devices having a first channel terminal coupled to said associated summing node, a second channel terminal coupled to ground, and a gate terminal coupled to an individual one of a plurality of intermediate logic inputs, and said combining step comprises activating said N-channel devices to discharge said global output.

18. The method of claim 11, wherein said sub-planes each have an associated summing node and said output circuit comprises an OR circuit for combining the outputs of said sub-planes, wherein conductors for said summing nodes are located in a first physical track, said global output is located in a second physical track, parallel to said first physical track, said summing node conductors are disposed end-to-end along said first physical track, said output circuit combines said summing nodes by coupling said summing nodes through a plurality of N-channel devices, one associated with each summing node, and said associated transistor is located adjacent to each of said summing node conductors, and said combining step comprises activating said N-channel devices to discharge said global output.

* * * * *